(12) United States Patent
Kodaira

(10) Patent No.: US 10,297,533 B2
(45) Date of Patent: May 21, 2019

(54) SEMICONDUCTOR DEVICE

(71) Applicant: FUJI ELECTRIC CO., LTD., Kanagawa (JP)

(72) Inventor: Yoshihiro Kodaira, Shenzhen (CN)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days.

(21) Appl. No.: 15/854,814

(22) Filed: Dec. 27, 2017

(65) Prior Publication Data
US 2018/0122723 A1 May 3, 2018

Related U.S. Application Data

(63) Continuation of application No. PCT/JP2016/086610, filed on Dec. 8, 2016.

(30) Foreign Application Priority Data

Jan. 15, 2016 (JP) ................. 2016-006451

(51) Int. Cl.
*H01L 23/52* (2006.01)
*H01L 23/492* (2006.01)
(Continued)

(52) U.S. Cl.
CPC ...... *H01L 23/4922* (2013.01); *H01L 21/4803* (2013.01); *H01L 21/4875* (2013.01);
(Continued)

(58) Field of Classification Search
CPC ......... H01L 2023/4031; H01L 23/3675; H01L 23/4006; H01L 25/072
(Continued)

(56) References Cited

U.S. PATENT DOCUMENTS 6,597,585 B2 7/2003 Ferber et al.
7,777,325 B2 * 8/2010 Yamada ................ H01L 25/072
257/690

(Continued)

FOREIGN PATENT DOCUMENTS

JP H0515445 U 2/1993
JP 2000208686 A 7/2000
(Continued)

OTHER PUBLICATIONS

International Search Report for International Patent Application No. PCT/JP2016/086610, issued by the Japan Patent Office dated Jan. 31, 2017.

*Primary Examiner* — Sheila V Clark

(57) ABSTRACT

A semiconductor device is provided, including: a bottom portion having a pad formed of a conductive material; a lid portion covering at least a part of the bottom portion; and a first terminal portion and a second terminal portion which are provided in parallel with each other, are fixed to the lid portion, and each contact a corresponding pad, wherein: the first terminal portion is provided with a first plate-shaped portion; the second terminal portion is provided with a second plate-shaped portion; and each of the first plate-shaped portion and the second plate-shaped portion has a principal surface in a direction facing the pad and is flexible in a direction toward the pad.

10 Claims, 12 Drawing Sheets

(51) Int. Cl.
  *H01L 25/07* (2006.01)
  *H01L 25/18* (2006.01)
  *H01L 21/48* (2006.01)
  *H01L 23/14* (2006.01)
  *H01L 23/32* (2006.01)
  *H01L 23/053* (2006.01)
  *H01L 23/498* (2006.01)
  *H01L 29/739* (2006.01)

(52) U.S. Cl.
  CPC .......... *H01L 23/053* (2013.01); *H01L 23/142* (2013.01); *H01L 23/32* (2013.01); *H01L 23/49811* (2013.01); *H01L 25/07* (2013.01); *H01L 25/072* (2013.01); *H01L 25/18* (2013.01); *H01L 29/7393* (2013.01)

(58) Field of Classification Search
  USPC .................................. 257/678, 691, 723, 724
  See application file for complete search history.

(56) References Cited

U.S. PATENT DOCUMENTS

| | | |
|---|---|---|
| 2008/0150102 A1 | 6/2008 | Yokomae et al. |
| 2012/0181682 A1* | 7/2012 | Soyano .................. H01L 23/04 257/692 |
| 2013/0250535 A1 | 9/2013 | Takamiya et al. |
| 2014/0118956 A1 | 5/2014 | Kim et al. |
| 2014/0210067 A1* | 7/2014 | Takamiya ............. H01L 23/055 257/698 |

FOREIGN PATENT DOCUMENTS

| | | |
|---|---|---|
| JP | 2001144249 A | 5/2001 |
| JP | 2008098585 A | 4/2008 |
| WO | 2012066833 A1 | 5/2012 |

\* cited by examiner

SEMICONDUCTOR DEVICE

The contents of the following Japanese patent applications are incorporated herein by reference:
NO. 2016-006451 filed in JP on Jan. 15, 2016, and
NO. PCT/JP2016/086610 filed on Dec. 8, 2016.

BACKGROUND

1. Technical Field

The present invention relates to a semiconductor device.

2. Related Art

Conventionally, semiconductor devices housing a semiconductor chip and the like are known to have a structure including a control terminal penetrating an opening provided to a resin casing (see Patent Document 1, for example). The control terminal is provided to a substrate having mounted thereon a semiconductor chip and the like. In assembly of a semiconductor device, the opening of the resin casing is penetrated by the control terminal when the resin casing is put on the substrate.

Patent Document 1: WO2012/66833

In order to easily assemble a semiconductor device, a predetermined clearance is provided between the opening and the control terminal. Therefore, variation of assembly jigs, external force or the like causes variation in a relative position of the control terminal in the opening.

SUMMARY

According to an aspect of the present invention, a semiconductor device is provided, including: a bottom portion having a pad formed of a conductive material; a lid portion covering at least a part of the bottom portion; and a first terminal portion and a second terminal portion which are provided in parallel with each other, are fixed to the lid portion, and each contact a corresponding pad. The first terminal portion may be provided with a first plate-shaped portion and the second terminal portion may be provided with a second plate-shaped portion. Each of the first plate-shaped portion and the second plate-shaped portion may have a principal surface in a direction facing the pad and may be flexible in a direction toward the pad.

The first plate-shaped portion and the second plate-shaped portion may be provided in parallel with each other. The principal surface of each of the first plate-shaped portion and the second plate-shaped portion may be provided with a concave portion which is concaved toward an inner side from an end.

The first plate-shaped portion may have a first inner end facing the second plate-shaped portion which is adjacent to the first plate-shaped portion, and a first outer end at an opposite side to the first inner end. The second plate-shaped portion may have a second inner end facing the first plate-shaped portion which is adjacent to the second plate-shaped portion, and a second outer end at an opposite side to the second inner end. In the first plate-shaped portion, an amount of the concave portion provided to the first inner end may be greater than an amount of the concave portion provided to the first outer end. In the second plate-shaped portion, an amount of the concave portion provided to the second inner end may be greater than an amount of the concave portion provided to the second outer end.

The first terminal portion may include: a first fixing portion which is provided extending from one end of the first plate-shaped portion and is fixed to the lid portion; and a first contacting portion which is provided extending from another end of the first plate-shaped portion and contacts the pad. The second terminal portion may include: a second fixing portion which is provided extending from one end of the second plate-shaped portion and is fixed to the lid portion; and a second contacting portion which is provided extending from another end of the second plate-shaped portion and contacts the pad.

A distance between the first contacting portion and the second contacting portion may be greater than a distance between the first fixing portion and the second fixing portion. In the first plate-shaped portion, a region closer to the first fixing portion may have a higher density of the concave portion than a region closer to the first contacting portion. In the second plate-shaped portion, a region closer to the second fixing portion may have a higher density of the concave portion than a region closer to the second contacting portion.

The first fixing portion and the second fixing portion may have a plate shape. A normal direction of a principal surface of the first fixing portion may be parallel to an extending direction of the first plate-shaped portion. A normal direction of a principal surface of the second fixing portion may be parallel to an extending direction of the second plate-shaped portion. The concave portion may be formed over a greater area in the second plate-shaped portion than in the first plate-shaped portion.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
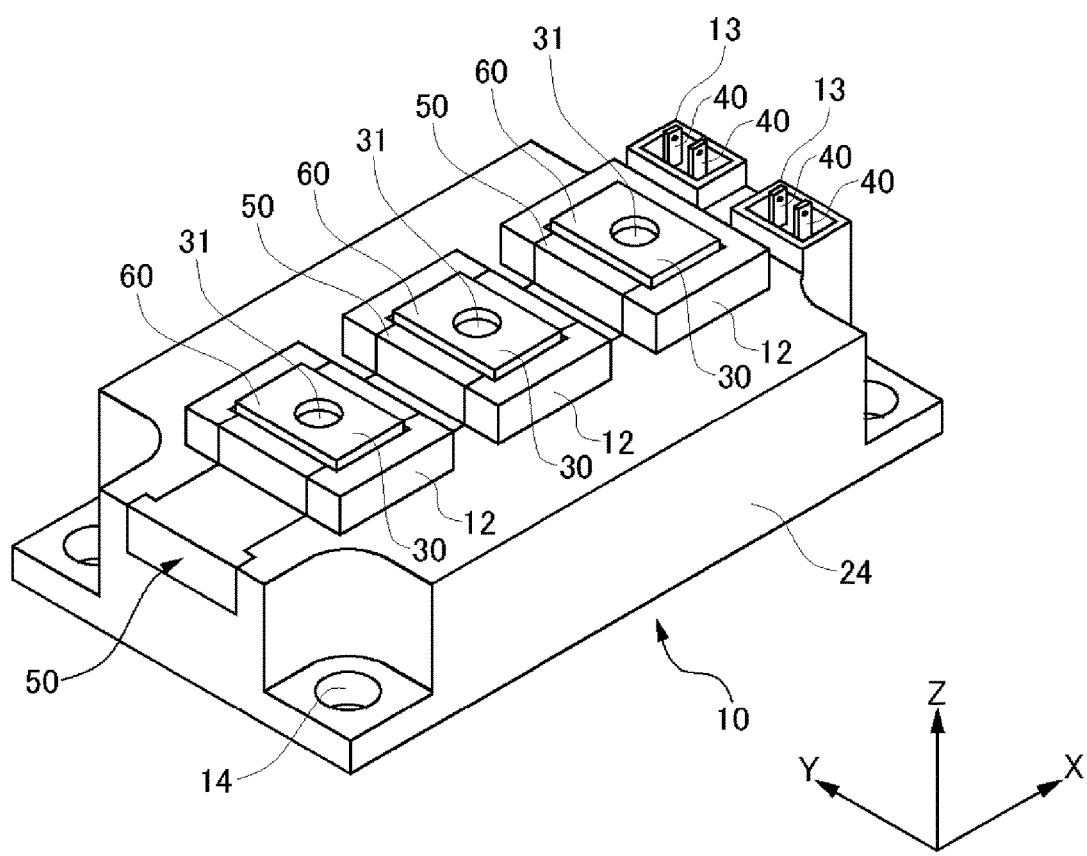
FIG. 1 is a perspective view schematically showing a semiconductor device 100 according to an embodiment of the present invention.

FIG. 1 is a perspective view schematically showing a semiconductor device 100 according to an embodiment of the present invention. The semiconductor device 100 houses therein an electronic circuit such as a semiconductor chip. The semiconductor device 100 in the present example includes a casing portion 10, a plurality of main terminals 60 and a plurality of control terminals 40. The control terminals 40 are an example of a terminal portion.

The casing portion 10 houses therein an electronic circuit such as a semiconductor chip. In an example, the casing portion 10 includes a bottom portion having a substrate on which the electronic circuit is mounted, a lid portion 24 and an insertion portion 50. The lid portion 24 is fixed to the bottom portion by adhesion or the like and covers at least a part of the bottom portion. An electronic circuit is mounted on the part of the bottom portion covered by the lid portion 24. The lid portion 24 is formed of an insulating material such as a resin. A through hole 14 such as a screw hole for fixing the semiconductor device 100 to an external component is provided at a corner of the lid portion 24.

Note that, in this specification, a plane parallel to the front surface of the casing portion 10 is defined as an X-Y plane. Also, a longitudinal direction and a lateral direction of the front surface of the casing portion 10 are respectively defined as an X-direction and a Y-direction. Note that the lateral direction may be the X-direction and the longitudinal direction may be the Y-direction. Also, a direction perpendicular to the X-Y plane is defined as a Z-direction. In this specification, the Z-direction is referred to as a height direction in some cases. Also, a direction from the bottom portion of the casing portion 10 toward the front surface of the lid portion 24 is referred to as an upward direction and a direction from the front surface of the lid portion 24 toward the bottom portion is referred to as a downward direction, in some cases. Note that the upward and downward directions do not necessarily coincide with gravitational directions.

The main terminal 60 is electrically connected to an electronic circuit covered by the lid portion 24. The main terminal 60 is formed of a conductive material. For example, each main terminal 60 forms a current path of a large current which flows in a power device such as an IGBT. At least a part of a principal surface portion 30 of the main terminal 60 is exposed at the front surface of the casing portion 10. The main terminal 60 in the present example has a plate shape.

The principal surface portion 30 of the main terminal 60 is exposed at the front surface of the lid portion 24 and has a plane substantially parallel to the front surface. A through hole 31 is formed in the principal surface portion 30 of the main terminal 60. When a screw or the like is inserted into the through hole 31, the semiconductor device 100 is thereby fixed to an external bus bar or the like.

The main terminal 60 further includes a side surface portion extending from the principal surface portion 30 toward the bottom portion of the casing portion 10. The side surface portion is electrically connected to an electronic circuit provided to the bottom portion of the casing portion 10.

An opening for exposing a part of the main terminal 60 is provided to the lid portion 24. The opening in the present example is a slit extending in the X-direction on the front surface of the lid portion 24, and exposes the principal surface portion 30 of the main terminal 60. The opening is provided at the Y-direction center of the front surface of the lid portion 24.

The insertion portion 50 is inserted into the opening, and provided facing the principal surface portion 30 of the main terminal 60. In the present example, the insertion portion 50 is arranged below the principal surface portion 30. In the insertion portion 50, a depression is provided at a position facing the through hole 31 of the principal surface portion 30. By providing a nut or the like to the depression, a screw or the like passing through the through hole 31 can be fastened to the depression.

The lid portion 24 includes a main terminal arrangement portion 12 on its front surface. The main terminal arrangement portion 12 is provided protruding in the upward direction from the front surface of the lid portion 24. The principal surface portion 30 of the main terminal 60 is exposed at the front surface of the main terminal arrangement portion 12. Note that the main terminal arrangement portion 12 is also provided with an opening for inserting thereinto the insertion portion 50.

The control terminal 40 is formed of a conductive material and has a shape of a plate whose width is smaller than that of the main terminal 60. The control terminal 40 is fixed to the lid portion 24. For example, the lid portion 24 is formed by pouring a resin into a predetermined mold. By pouring a resin while the control terminal 40 is arranged at a predetermined position in the mold, the lid portion 24 can be molded to be integral with the control terminal 40. The control terminal 40 may be insert-molded in the lid portion 24 and fixed thereto. The control terminal 40 may also be fixed to the lid portion 24 with adhesive or the like.

One end of the control terminal 40 is exposed at the front surface of the lid portion 24. The other end of the control terminal 40 is electrically connected to an electronic circuit mounted on the bottom portion of the casing portion 10. The lid portion 24 includes a control terminal arrangement portion 13 surrounding portions of the control terminal 40 other than its tip.

Figure 2:
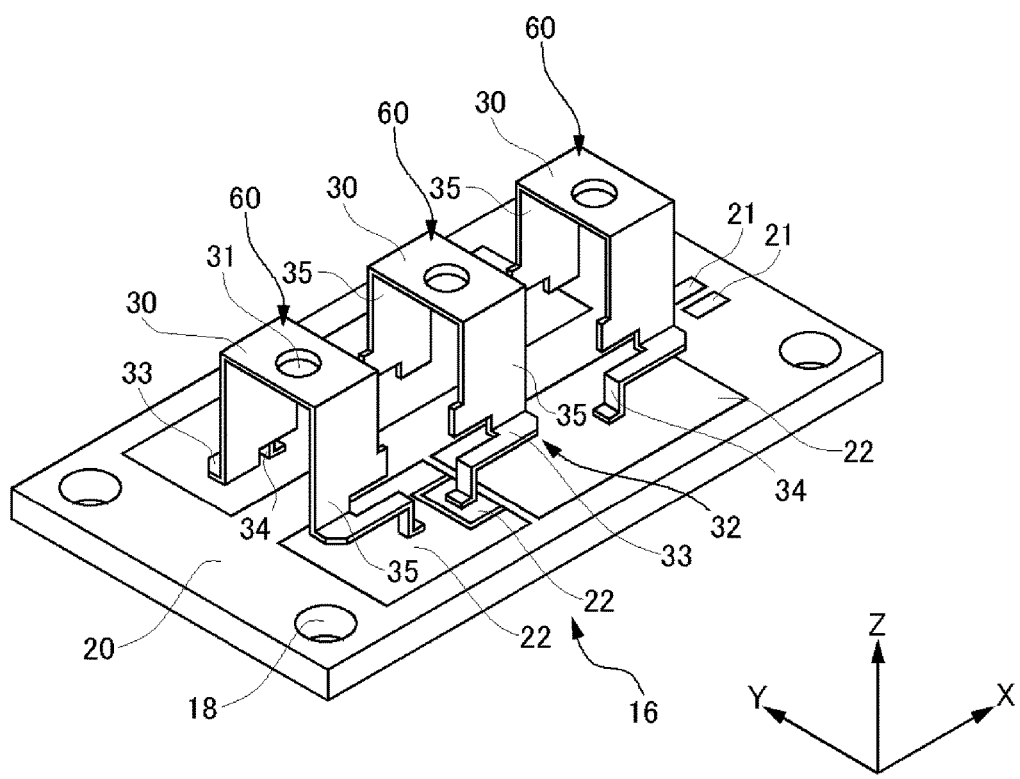
FIG. 2 is a perspective view schematically showing a bottom portion 16 of a casing portion 10 and main terminals 60.

FIG. 2 is a perspective view schematically showing the bottom portion 16 of the casing portion 10 and the main terminals 60. The bottom portion 16 includes a substrate 20 and an electronic circuit 22. The electronic circuit 22 includes a semiconductor chip, a wiring, a pad and the like. The electronic circuit 22 in the present example includes a pad 21 which is formed of a conductive material and is electrically connected to an end of the control terminal 40. The electronic circuit 22 may also include a pad electrically connected to the main terminal 60. The substrate 20 includes a metal plate such as a copper plate and an insulating layer covering the front surface of the metal plate. It may further include a metal layer on a side of the metal plate in the insulating layer. The electronic circuit 22 is provided on the insulating layer. A through hole 18 for fixing the semiconductor device 100 to an external component is provided at a corner of the substrate 20. The through hole 18 may be arranged to have substantially the same axis as the through hole 14 of the casing portion 10.

The semiconductor device 100 may include a plurality of main terminals 60. In the example in FIG. 2, three main terminals 60 are aligned along a direction in which the insertion portion 50 is inserted (the X-direction in the present example). Each main terminal 60 includes a principal surface portion 30, a side surface portion 35 and a foot portion 32. The principal surface portion 30 is arranged in parallel with the X-Y plane.

The side surface portion 35 is provided extending from both Y-direction ends of the principal surface portion 30 toward the bottom portion 16. Each side surface portion 35 is arranged in parallel with the X-Z plane. The foot portion 32 is coupled to an end side of the side surface portion 35 closer to the bottom portion 16, and is connected to the bottom portion 16.

The foot portion 32 is flexible such that the main terminal 60 can be inclined in accordance with applied force. For example, the foot portion 32 supports the main terminal 60 such that it can be inclined in the X-Z plane. The foot portion 32 may also support the main terminal 60 such that it can further be inclined in the Y-Z plane.

The foot portion 32 in the present example includes an extending portion 33 and a fixing portion 34. The extending portion 33 is coupled to a part of an end side of the side surface portion 35 closer to the bottom portion 16, and is provided extending along the X-direction. In an example, the extending portion 33 is provided at an outer side of each side surface portion 35, and extends from one X-direction end of an end side of the side surface portion 35 closer to the bottom portion 16 toward the other X-direction end of the end side. The extending portion 33 has a shape of a plate parallel to the X-Y plane.

The fixing portion 34 is provided at, from among ends of the extending portion 33, an end at the opposite side to an end connected to the side surface portion 35. The fixing portion 34 is provided extending from the end of the extending portion 33 toward the bottom portion 16. The lower end of the fixing portion 34 is fixed to the electronic circuit 22 with a solder or the like.

Such a configuration allows the main terminal 60 to be inclined in the X-Z plane in accordance with applied force. The insertion portion 50 is inserted into a space sandwiched by two facing side surface portions 35 of each main terminal 60. The insertion portion 50 can be easily inserted as the main terminal 60 is inclined in accordance with variation in a position at which the insertion portion 50 is inserted or the like. Note that the foot portion 32 may be provided at each side surface portion 35.

Figure 3:
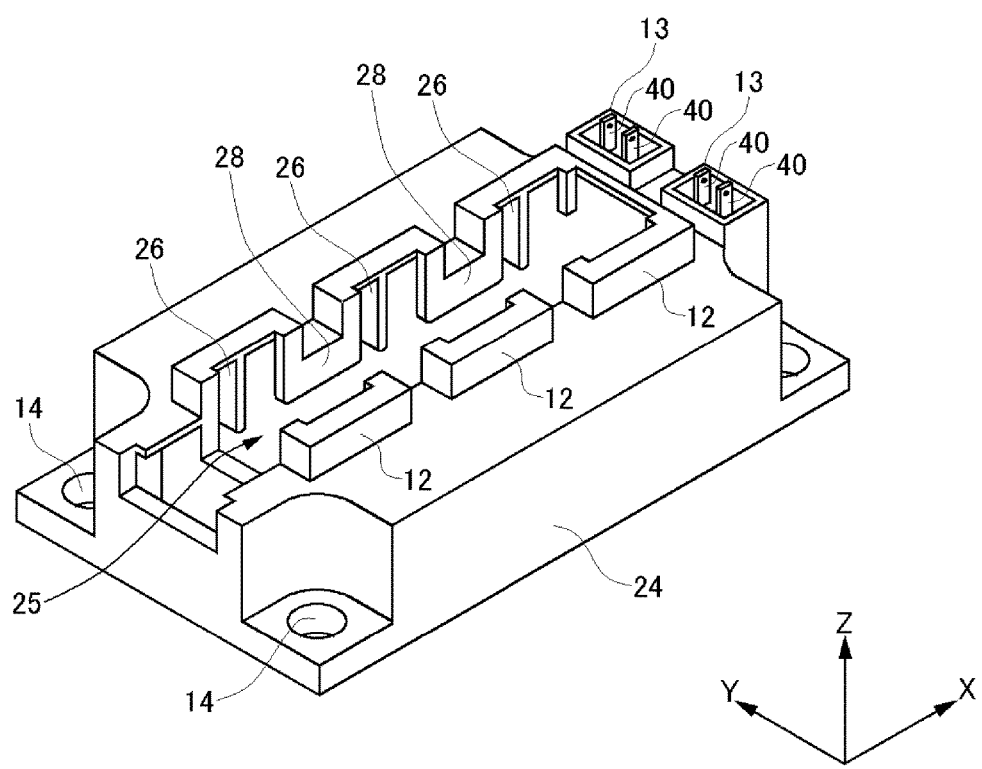
FIG. 3 is a perspective view schematically showing a lid portion 24.

FIG. 3 is a perspective view schematically showing the lid portion 24. The lid portion 24 includes, in addition to the configuration shown in FIG. 1, an opening 25 at its front surface. The opening 25 is formed extending from one X-direction end of the front surface of the lid portion 24 toward the other end.

On the front surface of the lid portion 24, the main terminal arrangement portion 12 is provided at both Y-direction sides of the opening 25. The main terminal arrangement portion 12 is provided at a position corresponding to each main terminal 60. The main terminal 60 is exposed at the opening of its corresponding main terminal arrangement portion 12. The lid portion 24 is assembled to the bottom portion 16 such that the lid portion 24 is put on the bottom portion 16 from above in the Z-direction. At this time, each main terminal 60 is inserted into the opening of the main terminal arrangement portion 12 along a sidewall of the opening. Also, the lower end of the control terminal 40 contacts the pad 21.

Each main terminal arrangement portion 12 includes a ceiling portion which is parallel to the X-Y plane. Also, the lid portion 24 includes a pressing portion 26 extending from the ceiling portion toward the bottom portion 16. When the main terminal 60 is inserted into the opening of the main terminal arrangement portion 12, the pressing portion 26 is arranged along the side surface portion 35 of the main terminal 60. The pressing portion 26 may be arranged at the X-direction center of the side surface portion 35.

The lower end of the pressing portion 26 abuts on the front surface of the extending portion 33 at the foot portion 32 of the main terminal 60. In this manner, the extending portion 33 is pressed toward the substrate 20 at the bottom portion 16, and a position of the extending portion 33 in the upward and downward directions can be defined. Also, a joint portion 28 is provided between main terminal arrangement portions 12 adjacent in the X-direction. The thickness of the joint portion 28 in the Z-direction is greater than that of the ceiling portion of the main terminal arrangement portion 12.

Figure 4:
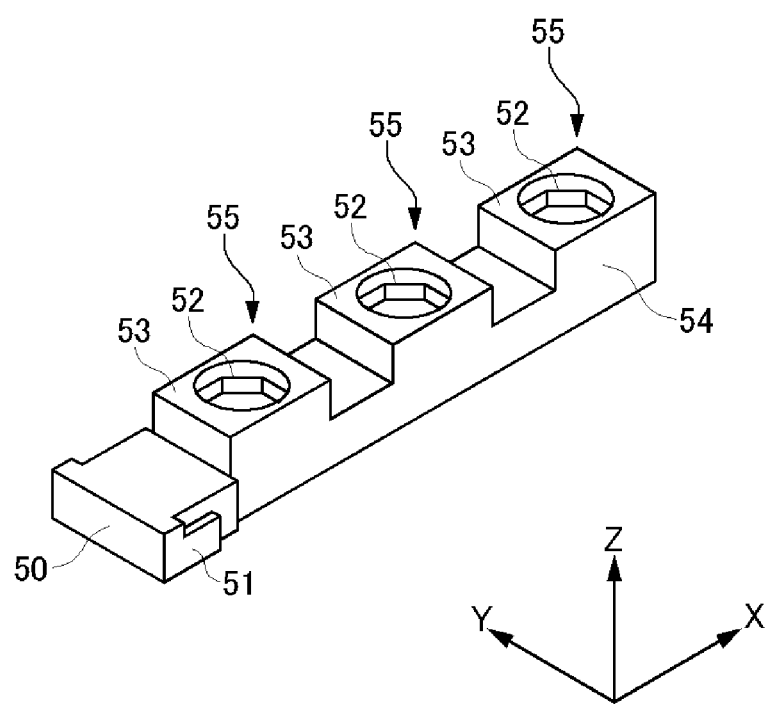
FIG. 4 is a perspective view schematically showing an insertion portion 50.

FIG. 4 is a perspective view schematically showing the insertion portion 50. The insertion portion 50 has the same width in the Y-direction and the same length in the X-direction as the opening 25 provided to the front surface of the lid portion 24. The insertion portion 50 is inserted into the opening 25 along the X-direction. The insertion portion 50 is inserted between the principal surface portion 30 of the main terminal 60 and the bottom portion 16.

The insertion portion 50 includes a principal surface facing portion 55 facing the principal surface portion 30 of each main terminal 60. Each principal surface facing portion 55 protrudes in the Z-direction from the front surface of the insertion portion 50. A depression 52 is provided to a front surface 53 of each principal surface facing portion 55.

The depression 52 is provided at a position facing the through hole 31 of the main terminal 60. In an example, the depression 52 is provided at the center of the front surface 53 of the principal surface facing portion 55. The depression 52 may have a greater diameter than that of the through hole 31. A nut or the like is arranged inside the depression 52. A screw or the like passing through the through hole 31 is fastened to the nut or the like inside the depression 52.

The insertion portion 50 may also include a locking portion 51 which is fitted with the lid portion 24 to fix the insertion portion 50 to the lid portion 24. For example, the locking portion 51 is provided at a sidewall 54 at one end of the insertion portion 50 that is inserted into the opening 25 posterior to the other end. The locking portion 51 in the present example protrudes in the Y-direction. The locking portion 51 is fitted with a depression provided to the lid portion 24. The insertion portion 50 may also be fixed to the lid portion 24 with an adhesive or the like when inserted into the opening 25.

First Example Embodiment

Figure 5:
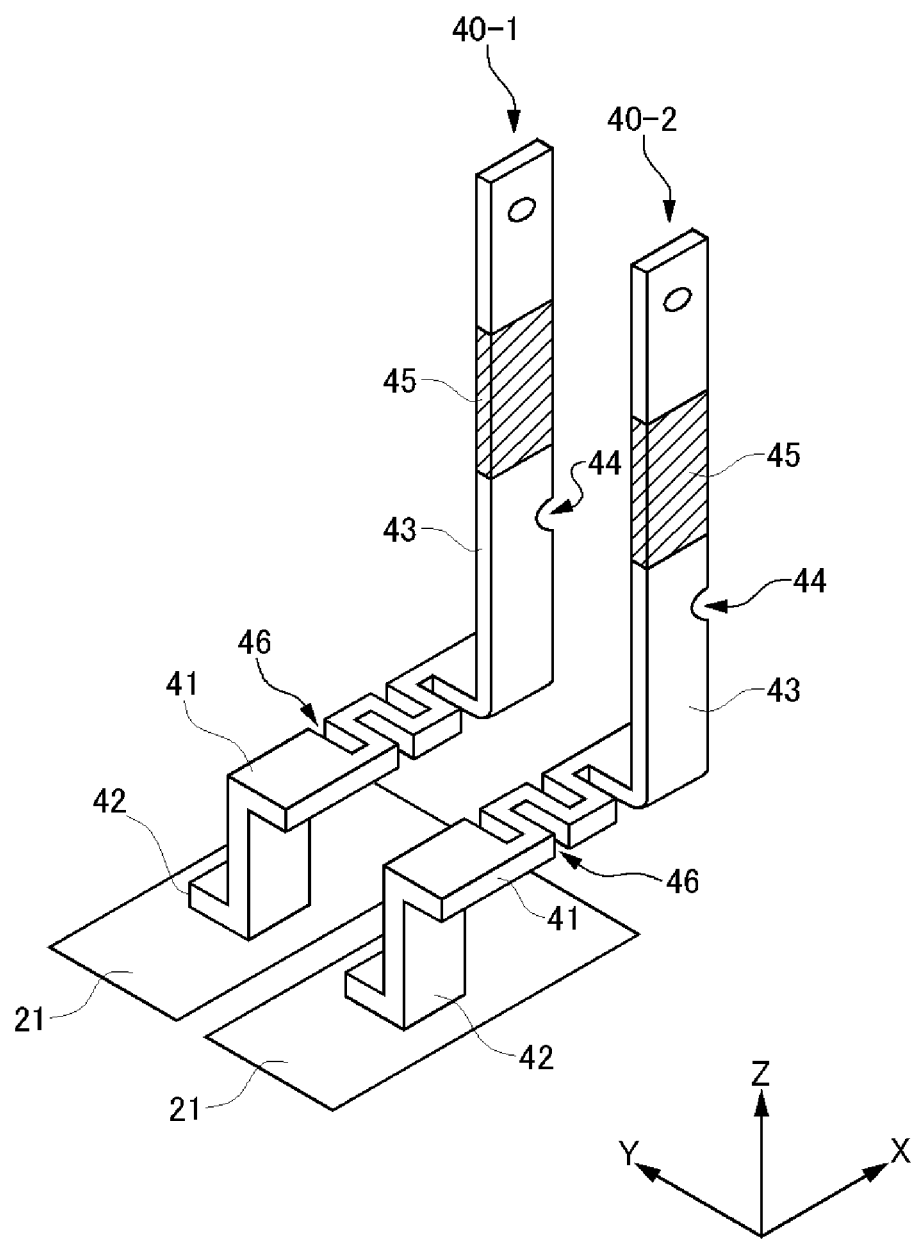
FIG. 5 is a perspective view showing control terminals 40 according to a first example embodiment.

FIG. 5 is a perspective view showing control terminals 40 according to a first example embodiment. FIG. 5 shows a first control terminal 40-1 and a second control terminal 40-2 provided in parallel with each other. The two control terminals 40 are fixed to the lid portion 24 and each contact their corresponding pad 21.

Each control terminal 40 includes a plate-shaped portion 41, a contacting portion 42 and a fixing portion 43. The plate-shaped portion 41 is formed of a plate-shaped conductive material. The plate-shaped portion 41 is arranged such that its principal surface is directed to face the pad 21. The principal surface of the plate-shaped portion 41 may be parallel to the principal surface of the substrate 20, or may be inclined by approximately 30 degrees or less relative to the principal surface of the substrate 20. The principal surface of the plate-shaped portion 41 refers to, from among its plate-shaped surfaces, a surface having the largest area and a surface parallel to that surface. The plate-shaped portion 41 is flexible in a direction toward the pad 21 (the Z-direction in the present example). The plate-shaped portion 41 in the present example extends in parallel with the pad 21.

The fixing portion 43 is provided extending upward in the Z-direction from one X-direction end of the plate-shaped portion 41, and is fixed to the lid portion 24. The fixing portion 43 may have a shape of a plate such that the normal direction of its principal surface (the Y-direction in the present example) is orthogonal to the normal direction of the principal surface of the plate-shaped portion 41 (the Z-direction in the present example) and the extending direction of the plate-shaped portion 41 (the X-direction in the present example). That is, for two adjacent control terminals 40, the principal surfaces of respective fixing portions 43 may be arranged to face each other.

A fixing region 45 to be fixed to the lid portion 24 is provided at a middle portion of the fixing portion 43 in the Z-direction. The fixing region 45 may be in tight contact with a resin of the lid portion 24, or may be adhered to the lid portion 24 with an adhesive.

The fixing portion 43 may also include an alignment portion 44. For example, the alignment portion 44 defines a position of the control terminal 40 in a mold for molding the lid portion 24. The alignment portion 44 in the present example is a concave portion provided to the fixing portion 43.

The contacting portion 42 is provided extending from the other end of the plate-shaped portion 41 that is at the opposite side to the fixing portion 43, and contacts the pad 21. Note that the contacting portion 42 is not fixed to the pad 21. When the lid portion 24 and the bottom portion 16 are assembled to each other, the contacting portion 42 thereby contacts the pad 21.

The contacting portion 42 may, in a region extending toward the pad 21, have a shape of a plate such that the normal direction of its principal surface (the Y-direction in the present example) is orthogonal to the normal direction of the principal surface of the plate-shaped portion 41 (the Z-direction in the present example) and the extending direction of the plate-shaped portion 41 (the X-direction in the present example). That is, for two adjacent control terminals 40, the principal surfaces of regions of the contacting portions 42 extending toward the pads 21 may be arranged to face each other.

Also, with the lid portion 24 and the bottom portion 16 being assembled to each other, the plate-shaped portion 41 presses the contacting portion 42 in a direction toward the pad 21. That is, when the lid portion 24 and the bottom portion 16 are assembled to each other, the contacting portion 42 is pressed upward in the Z-direction by the pad 21, and a warping of the plate-shaped portion 41 is caused. The plate-shaped portion 41 presses the contacting portion 42 downward with restoring force in response to the warping.

The plate-shaped portion 41 in the present example is provided with concave portions 46 which are concaved toward an inner side of the principal surface from an end (a long side) of the principal surface. The concave portions 46 in the present example are provided extending in a direction orthogonal to the extending direction of the plate-shaped portion 41 (the Y-direction in the present example) from an end (a long side) of the plate-shaped portion 41.

The concave portions 46 may be provided at each of two opposite ends (two long sides) of the principal surface of the plate-shaped portion 41. The concave portions 46 may be provided at the two ends alternately in the extending direction of the plate-shaped portion 41. The length of each concave portion 46 in the Y-direction may be a half or more of the width of the plate-shaped portion 41 in the Y-direction. Thus, by providing the plate-shaped portion 41 with concave portions 46 extending in the Y-direction, the flexibility of the plate-shaped portion 41 in the Z-direction can be improved.

In the semiconductor device 100, the control terminal 40 is fixed to the lid portion 24. Therefore, variation in a position of the control terminal 40 in the X-Y plane relative to the lid portion 24 is not caused. Also, when the lid portion 24 and the bottom portion 16 is assembled to each other, the control terminal 40 can be prevented from moving down in the Z-direction due to friction with the lid portion 24. Therefore, the control terminal 40 can be precisely connected to an external device or the like. Also, since the control terminal 40 is flexible in the Z-direction, the control terminal 40 fixed to the lid portion 24 can be pressed toward the pad 21 provided at the bottom portion 16. In this manner, reliability for electrical connection between the control terminal 40 and the pad 21 can also be enhanced.

Also, the plate-shaped portion 41 is provided such that its principal surface faces the pad 21. Therefore, while the plate-shaped portion 41 and the contacting portion 42 move in the Z-direction, their movement in the X-Y plane is suppressed. Accordingly, it is possible to prevent two adjacent control terminals 40 from contacting each other. Note that respective plate-shaped portions 41 of two adjacent control terminals 40 are provided extending in parallel with each other. Note that, in this specification, the word "parallel" does not only refer to things that are strictly parallel to each other, but includes things that are inclined relative to each other by approximately 20 degrees or less.

Second Example Embodiment

Figure 6:
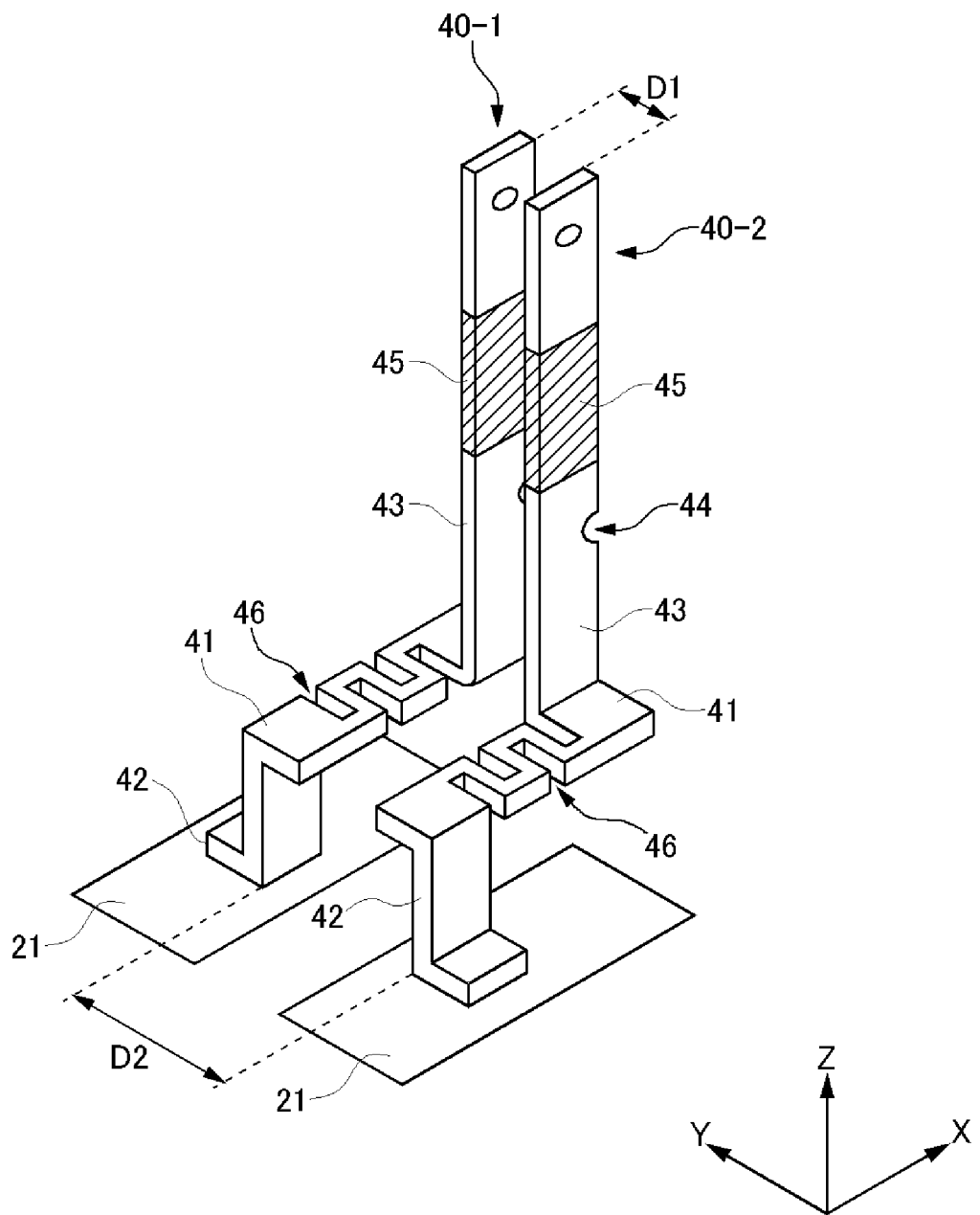
FIG. 6 is a perspective view showing control terminals 40 according to a second example embodiment.

FIG. 6 is a perspective view showing control terminals 40 according to a second example embodiment. In the present example, for two adjacent control terminals 40, a distance D2 between contacting portions 42 is greater than a distance D1 between fixing portions 43. The distances D1 and D2 refer to the shortest distance between respective members. Such a structure makes it possible to suppress contact of contacting portions 42 with each other, which are likely to move relatively largely in the X-Y plane.

Figure 7:
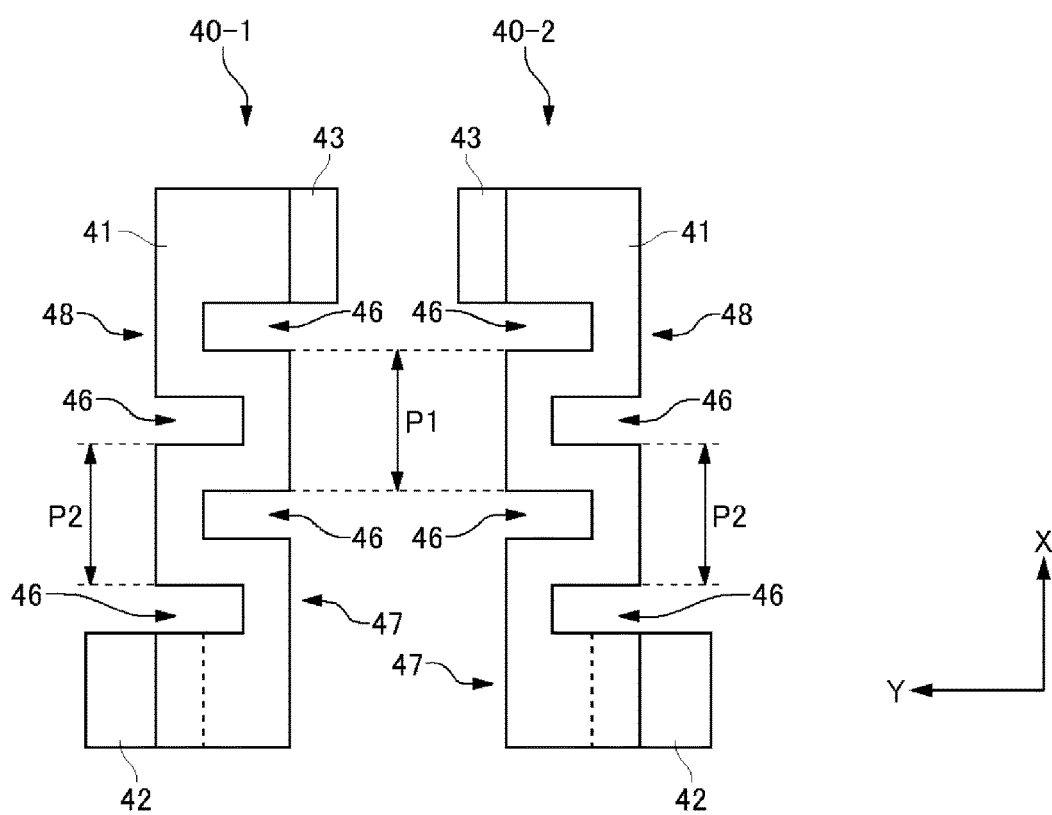
FIG. 7 is a top view showing control terminals 40 according to the second example embodiment.

FIG. 7 is a top view showing control terminals 40 according to the second example embodiment. FIG. 7 shows the control terminal 40 as seen from above in the Z-direction. From among ends (long sides) of each plate-shaped portion 41 along the extending direction, one facing its adjacent plate-shaped portion 41 is referred to as an inner end 47 and one at the opposite side to the inner end 47 is referred to as an outer end 48.

The fixing portion 43 is connected to the inner end 47 of the plate-shaped portion 41, and the contacting portion 42 is connected to the outer end 48 of the plate-shaped portion 41. Such an arrangement makes it possible to increase a distance between adjacent contacting portions 42 while allowing the plate-shaped portion 41 to be flexible in the Z-direction.

Also, concave portions 46 are provided at each of the inner end 47 and the outer end 48 of the plate-shaped portion 41. In the present example, a distance P1 between concave portions 46 provided at the inner end 47 and a distance P2 between concave portions 46 provided at the outer end 48 are equal. Also, concave portions 46 provided at the inner end 47 and concave portions 46 provided at the outer end 48 have the same shape and size.

Third Example Embodiment

Figure 8:
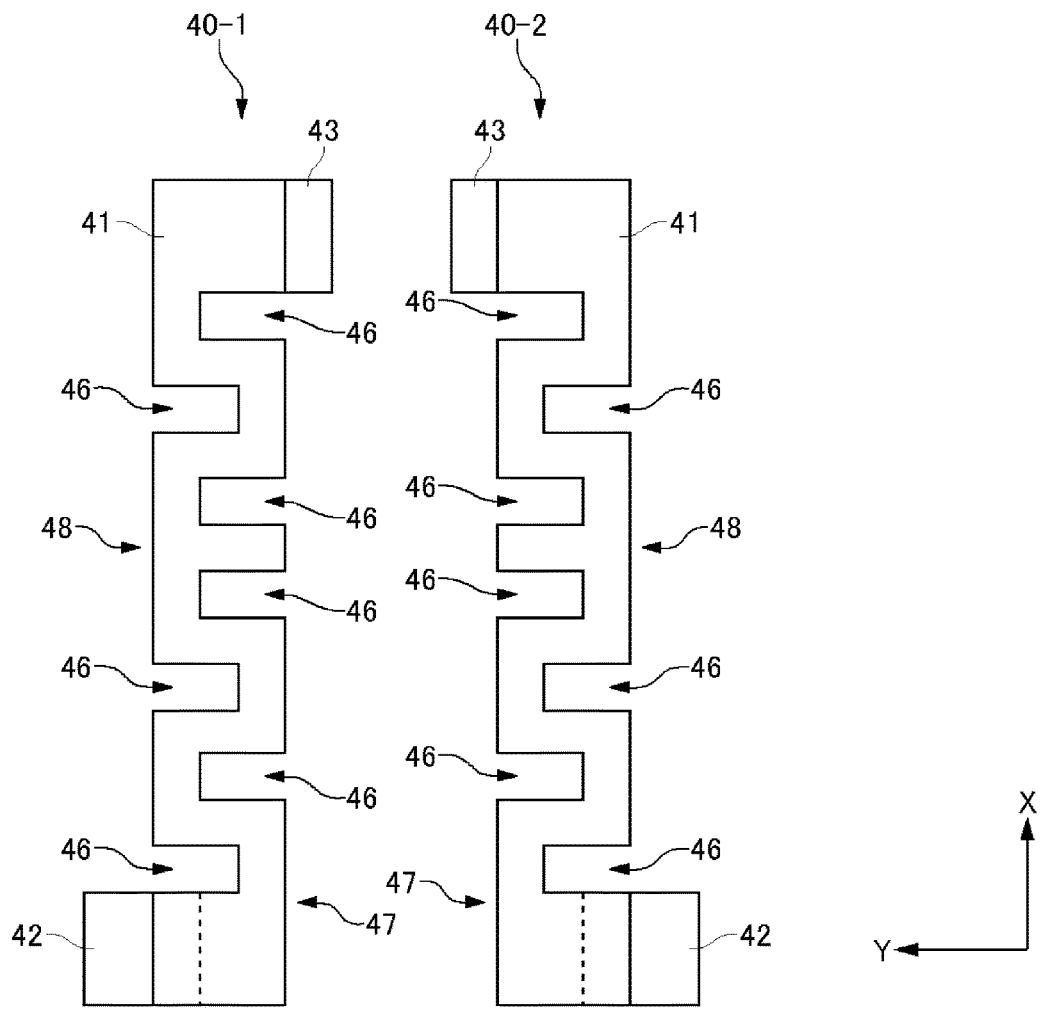
FIG. 8 is a top view showing control terminals 40 according to a third example embodiment.

FIG. 8 is a top view showing control terminals 40 according to a third example embodiment. In the present example, for each plate-shaped portion 41, the amount of concave portions 46 provided at the inner end 47 is greater than the amount of concave portions 46 provided at the outer end 48. Here, the amount of concave portions refers to the total area of concave portions in top view.

In the example shown in FIG. 8, the inner end 47 and the outer end 48 are provided with concave portions 46 having the same shape and the same size. Note that the number of concave portions 46 provided at the inner end 47 is greater than the number of concave portions 46 provided at the outer end 48. Therefore, the amount of concave portions 46 provided at the inner end 47 is greater than the amount of concave portions 46 provided at the outer end 48.

By controlling the amount of concave portions 46 in this manner, even if plate-shaped portions 41 are curved in the X-Y plane, the plate-shaped portions 41 are curved in directions such that respective contacting portions 42 are distanced away from each other. Therefore, contact of the respective contacting portions 42 with each other can be suppressed.

Note that the size of each one of concave portions 46 may be altered between the inner end 47 and the outer end 48. That is, by altering at least one of the number of concave portions 46 and the size of each one of concave portion 46 between the inner end 47 and the outer end 48, the amount of concave portions 46 at the inner end 47 can be made greater than the amount of concave portions 46 at the outer end 48.

Fourth Example Embodiment

Figure 9:
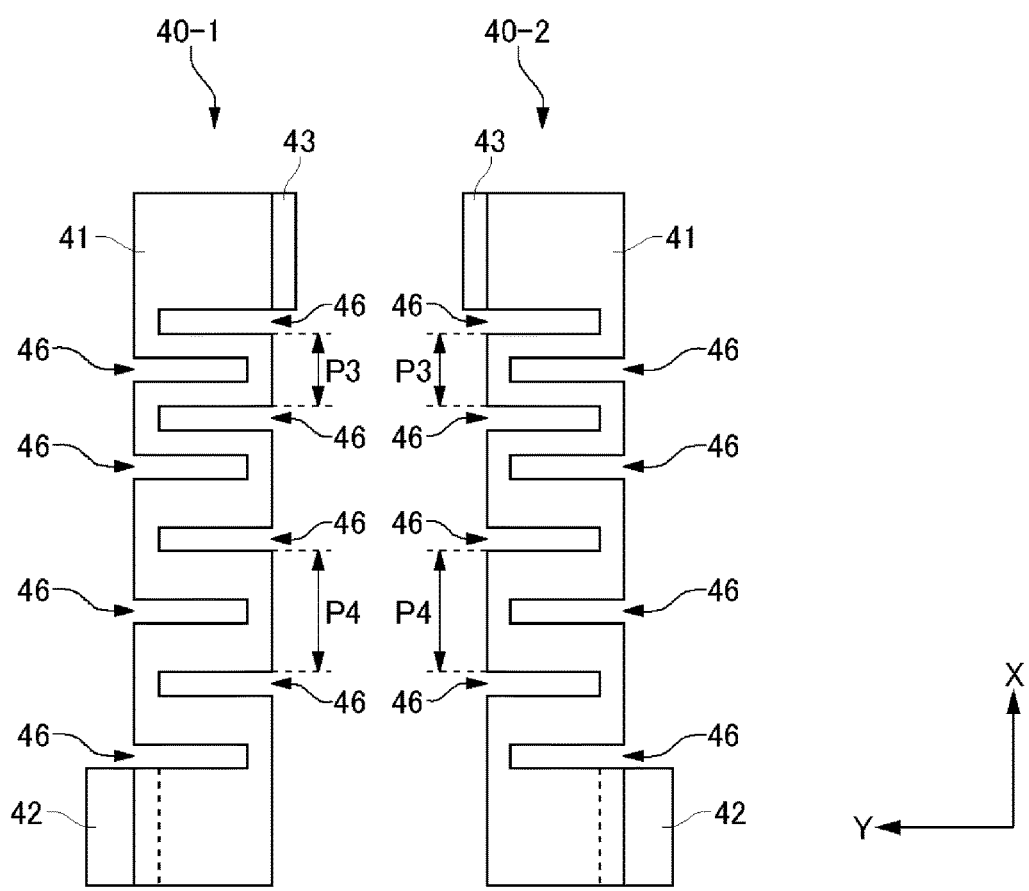
FIG. 9 is a top view showing control terminals 40 according to a fourth example embodiment.

FIG. 9 is a top view showing control terminals 40 according to a fourth example embodiment. In the present example, for each plate-shaped portion 41, a region closer to the fixing portion 43 has a higher density of concave portions 46 than a region closer to the contacting portion 42. Here, the density of concave portions 46 refers to the amount of concave portions 46 per unit length in the plate-shaped portion 41.

In the example shown in FIG. 9, concave portions 46 having the same shape and the same size are provided in the entire plate-shaped portion 41. Note that an interval P3 between concave portions 46 at a region closer to the fixing portion 43 is smaller than an interval P4 between concave portions 46 at a region closer to the contacting portion 42. Therefore, the density of concave portions 46 provided closer to the fixing portion 43 is higher than the density of concave portions 46 provided closer to the contacting portion 42. By controlling the density of concave portions 46 in this manner, a region of the plate-shaped portion 41 closer to the fixing portion 43 is easily curved in the Y-direction, and a range within which the contacting portion 42 can move in the Y-direction can be expanded. In an example, it is preferable that the contacting portion 42 can move approximately 300 μm in the Y-direction.

Also, for each plate-shaped portion 41, a region closer to the fixing portion 43 may have a lower density of concave portions 46 than a region closer to the contacting portion 42. In this case, a region of the plate-shaped portion 41 closer to the fixing portion 43 is restricted to be curved in the X-Y plane, and contact of contacting portions 42 with each other can be suppressed.

Fifth Example Embodiment

Figure 10:
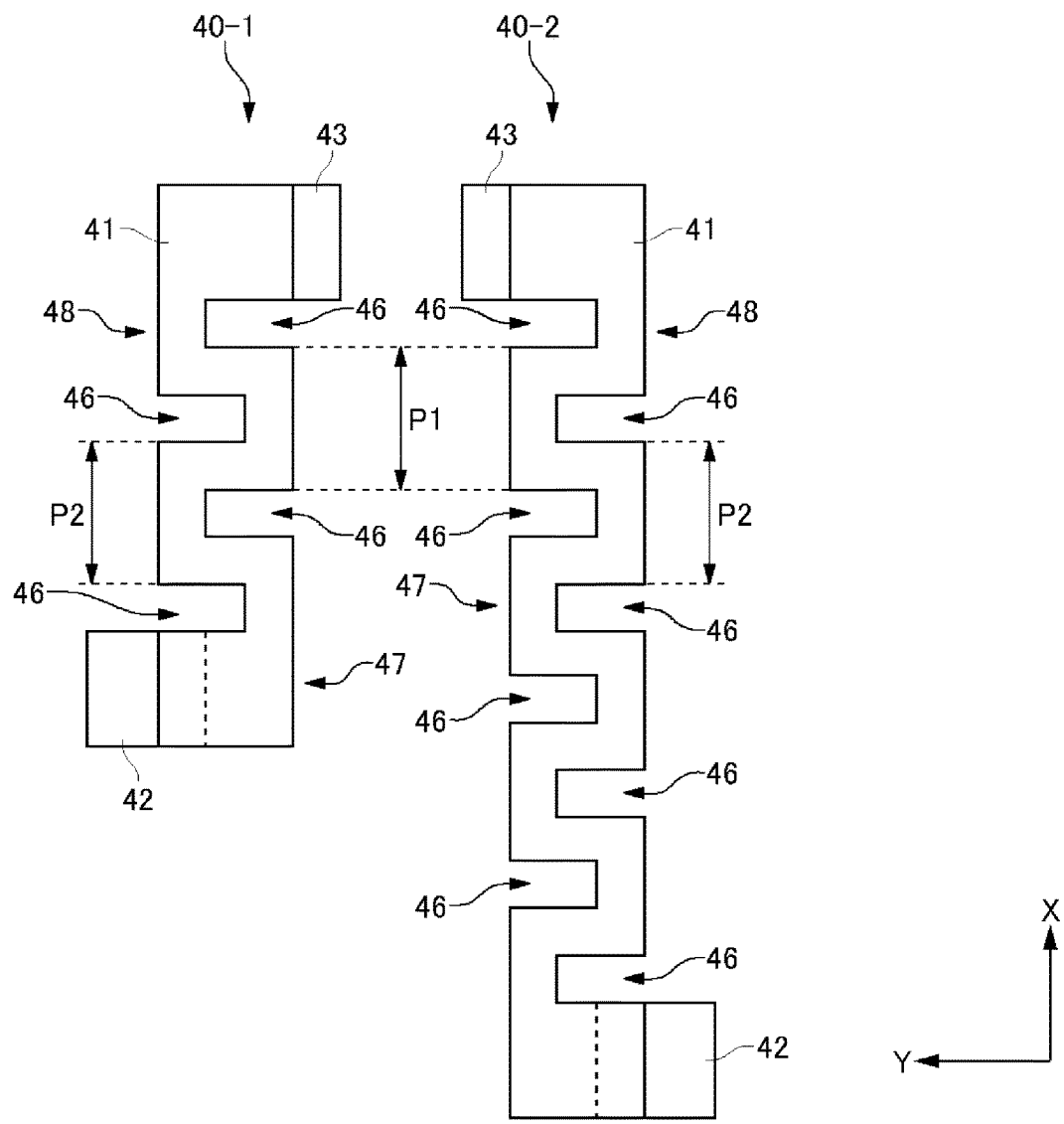
FIG. 10 is a top view showing control terminals 40 according to a fifth example embodiment.

FIG. 10 is a top view showing control terminals 40 according to a fifth example embodiment. In the present example, concave portions 46 are provided over a greater area in the plate-shaped portion 41 of the second control terminal 40-2 than in the plate-shaped portion 41 of the first control terminal 40-1. That is, the absolute value of the X-direction length of a region in which concave portions 46 are provided in the second control terminal 40-2 is greater than the absolute value of the X-direction length of a region in which concave portions 46 are provided in the first control terminal 40-1. Such a configuration allows a range within which the contacting portion 42 of the second control terminal 40-2 can move in the Y-direction to be greater than a range within which the contacting portion 42 of the first control terminal 40-1 can move in the Y-direction.

In the present example, the plate-shaped portion 41 of the second control terminal 40-2 has a greater length than the plate-shaped portion 41 of the first control terminal 40-1. Therefore, the second control terminal 40-2 contacts the pad 21 provided closer to the inner part of the substrate 20. On the other hand, an amount of warping of the substrate 20 caused by temperature change or the like increases toward the inner part of the substrate 20. The configuration in the present example makes it possible to easily comply with variation in the Y-direction position of the pad 21 caused by warping of the substrate 20 or the like.

Sixth Example Embodiment

Figure 11:
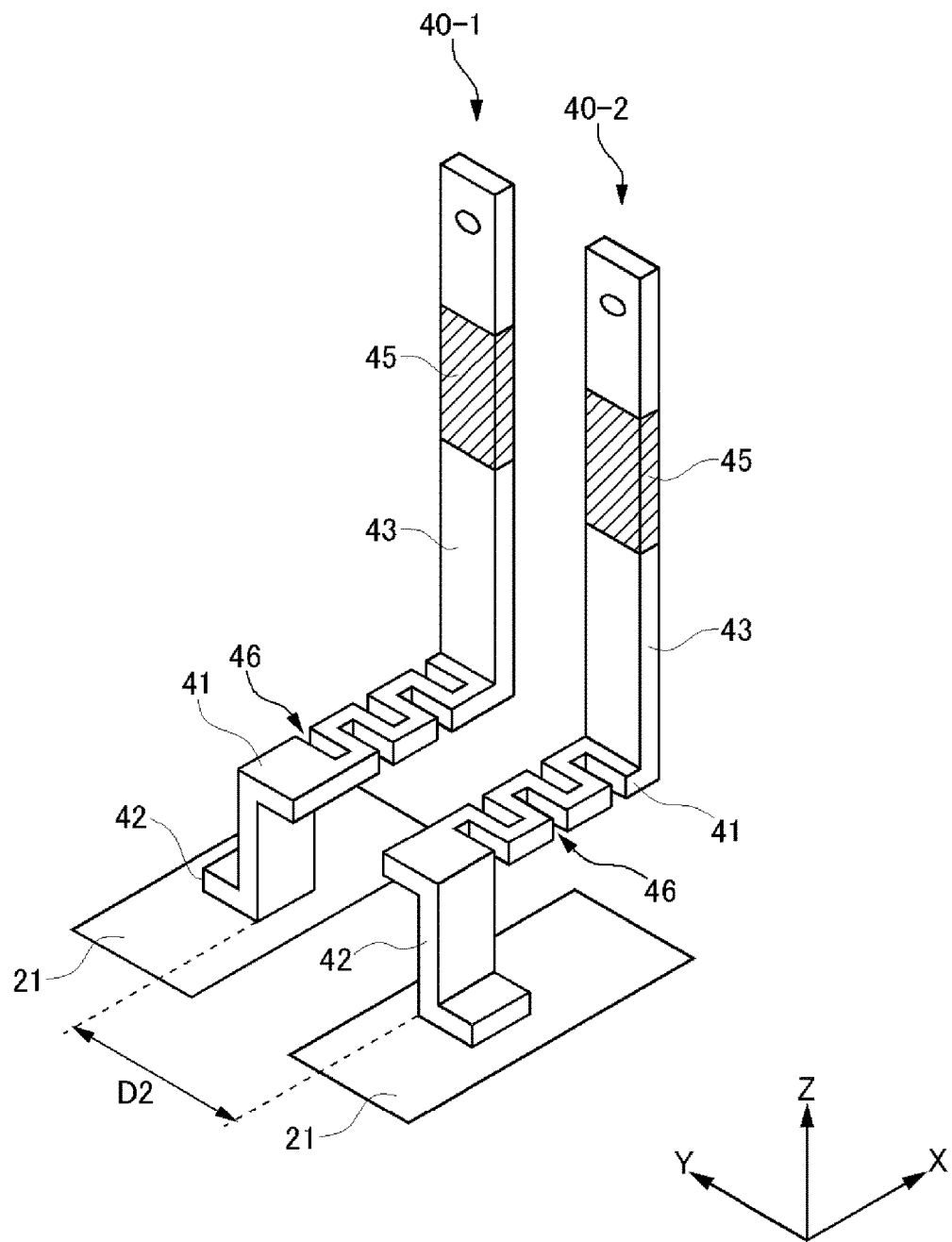
FIG. 11 is a perspective view showing control terminals 40 according to a sixth example embodiment.

FIG. 11 is a perspective view showing control terminals 40 according to a sixth example embodiment. In the present example, the normal direction of the principal surface of the fixing portion 43 (i.e. the X-direction) is parallel to the extending direction of the plate-shaped portion 41. In the present example, the fixing portion 43 having the same width as the plate-shaped portion 41 is provided to be bendable in the Z-direction at an end of the plate-shaped portion 41.

Such a configuration allows the plate-shaped portion 41 to be more easily curved in the Z-direction. Also, a region in which concave portions 46 can be formed can be expanded.

Also, a region of the contacting portion 42 extending toward the pad 21 may be, in a similar manner to that of the fixing portion 43, provided such that the normal direction of its principal surface is parallel to the extending direction of the plate-shaped portion 41 (the X-direction). Such a configuration allows the plate-shaped portion 41 to be more easily curved in the Z-direction. Also, a region in which concave portions 46 can be formed can further be expanded.

Figure 12:
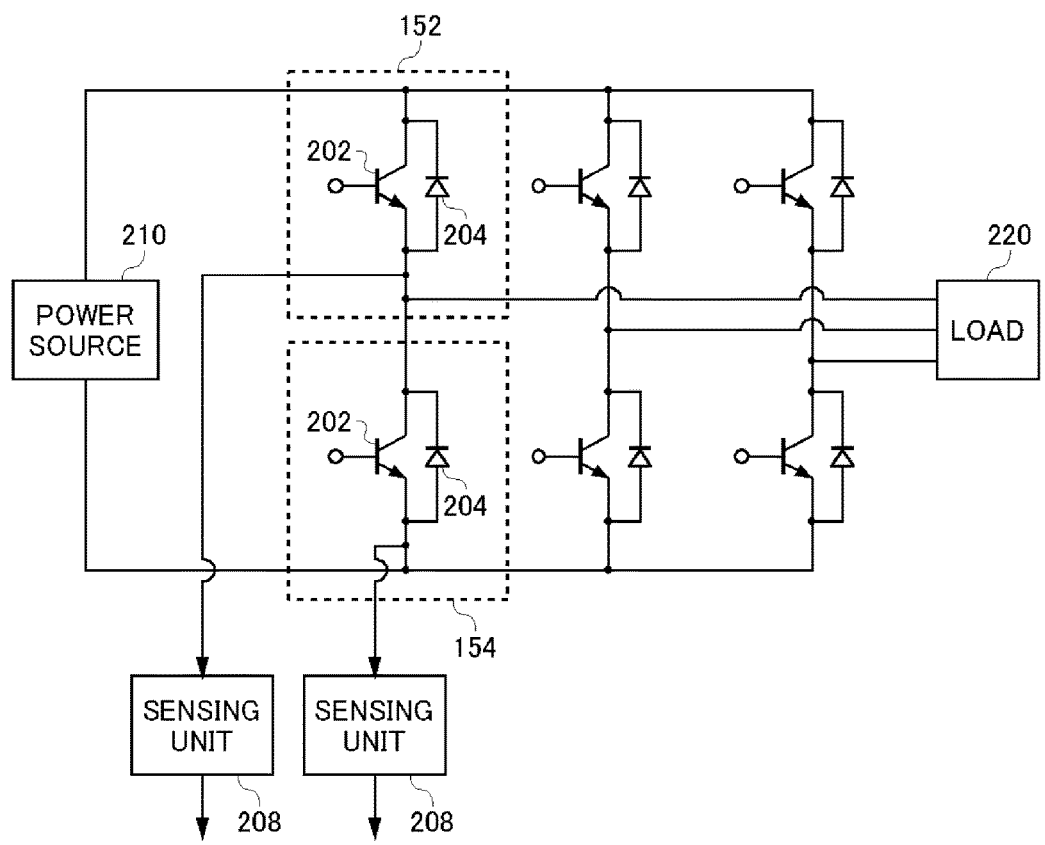
FIG. 12 shows an example of a circuit 300 including an electronic circuit housed in the semiconductor device 100.

FIG. 12 shows an example of a circuit 300 including an electronic circuit housed in the semiconductor device 100. The circuit 300 in the present example is a three-phase inverter circuit provided between a power source 210 and a load 220. The load 220 is, for example, a three-phase motor. The circuit 300 converts electric power supplied from the power source 210 into three-phase signals (AC voltage) and supplies the converted signals to the load 220.

The circuit 300 includes three bridges corresponding to three-phase signals. Each bridge includes an upper arm 152 and a lower arm 154 provided in series between a positive side wiring and a negative side wiring. Each arm is provided with a transistor 202 such as an IGBT and a diode 204 such as an FWD. Signals of each phase are output from a connection point of the upper arm 152 and the lower arm 154.

The circuit 300 also includes two sensing units 208. One sensing unit 208 detects an electric current at the connection point of the upper arm 152 and the lower arm 154. The other sensing unit 208 detects an electric current at the connection point of the lower arm 154 and a reference potential.

In the present example, one semiconductor device 100 houses the upper arm 152, the lower arm 154 and the sensing unit 208 in one bridge. Each of three main terminals 60 may be connected to the power source 210 and the load 220. A pair of control terminals 40 may each be connected to the sensing unit 208 and a gate driving unit. In another example, one semiconductor device 100 may house one arm, or one semiconductor device 100 may house the entire circuit 300.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

EXPLANATION OF REFERENCES

10: casing portion, 12: main terminal arrangement portion, 13: control terminal arrangement portion, 14: through hole, 16: bottom portion, 18: through hole, 20: substrate, 21: pad, 22: electronic circuit, 24: lid portion, 25: opening, 26: pressing portion, 28: joint portion, 30: principal surface portion, 31: through hole, 32: foot portion, 33: extending portion, 34: fixing portion, 35: side surface portion, 40: control terminal, 41: plate-shaped portion, 42: contacting portion, 43: fixing portion, 44: alignment portion, 45: fixing region, 46: concave portion, 47: inner end, 48: outer end, 50: insertion portion, 51: locking portion, 52: depression, 53: front surface, 54: sidewall, 55: principal surface facing portion, 60: main terminal, 100: semiconductor device, 152: upper arm, 154: lower arm, 202: transistor, 204: diode, 208: sensing unit, 210: power source, 220: load, 300: circuit

What is claimed is:

1. A semiconductor device comprising:
   a bottom portion having a pad formed of a conductive material;
   a lid portion covering at least a part of the bottom portion;
   a first terminal portion and a second terminal portion which are provided in parallel with each other, are fixed to the lid portion, and each contact a corresponding pad;
   a plurality of main terminals which form a current path of a large current flowing in a power device; and
   a plurality of control terminals, each of which has a shape of a plate whose width is smaller than each of the plurality of main terminals, wherein:
   the plurality of control terminal are the first terminal portion and the second terminal portion;
   the first terminal portion is provided with a first plate-shaped portion and the second terminal portion is provided with a second plate-shaped portion; and
   each of the first plate-shaped portion and the second plate-shaped portion has a principal surface in a direction facing the pad and is flexible in a direction toward the pad, and extends laterally with respect to the pad.

2. The semiconductor device according to claim 1, wherein the first plate-shaped portion and the second plate-shaped portion are provided in parallel with each other.

3. A semiconductor device comprising:
   a bottom portion having a pad formed of a conductive material;
   a lid portion covering at least a part of the bottom portion;
   a first terminal portion and a second terminal portion which are provided in parallel with each other, are fixed to the lid portion, and each contact a corresponding pad;
   a plurality of main terminals which form a current path of a large current flowing in a power device; and
   a plurality of control terminals, each of which has a shape of a plate whose width is smaller than each of the plurality of main terminals, wherein:
   the plurality of control terminal are the first terminal portion and the second terminal portion;
   the first terminal portion is provided with a first plate-shaped portion and the second terminal portion is provided with a second plate-shaped portion; and
   each of the first plate-shaped portion and the second plate-shaped portion has a principal surface in a direction facing the pad and is flexible in a direction toward the pad, wherein the principal surface of each of the first plate-shaped portion and the second plate-shaped portion is provided with a concave portion which is concaved toward an inner side from an end.

4. The semiconductor device according to claim 3, wherein:
   the first plate-shaped portion has a first inner end facing the second plate-shaped portion which is adjacent to the first plate-shaped portion, and a first outer end at an opposite side to the first inner end;
   the second plate-shaped portion has a second inner end facing the first plate-shaped portion which is adjacent to the second plate-shaped portion, and a second outer end at an opposite side to the second inner end;
   in the first plate-shaped portion, an amount of the concave portion provided to the first inner end is greater than an amount of the concave portion provided to the first outer end; and
   in the second plate-shaped portion, an amount of the concave portion provided to the second inner end is greater than an amount of the concave portion provided to the second outer end.

5. The semiconductor device according to claim 3, wherein:
   the first terminal portion comprises
     a first fixing portion which is provided extending from one end of the first plate-shaped portion and is fixed to the lid portion, and
     a first contacting portion which is provided extending from another end of the first plate-shaped portion and contacts the pad; and
   the second terminal portion comprises
     a second fixing portion which is provided extending from one end of the second plate-shaped portion and is fixed to the lid portion, and
     a second contacting portion which is provided extending from another end of the second plate-shaped portion and contacts the pad.

6. A semiconductor device comprising:
   a bottom portion having a pad formed of a conductive material;
   a lid portion covering at least a part of the bottom portion;
   a first terminal portion and a second terminal portion which are provided in parallel with each other, are fixed to the lid portion, and each contact a corresponding a plurality of main terminals which form a current path of a large current flowing in a power device; and a plurality of control terminals, each of which has a shape of a plate whose width is smaller than each of the plurality of main terminals, wherein:
the plurality of control terminal are the first terminal portion and the second terminal portion;
the first terminal portion is provided with a first plate-shaped portion and the second terminal portion is provided with a second plate-shaped portion; and
each of the first plate-shaped portion and the second plate-shaped portion has a principal surface in a direction facing the pad and is flexible in a direction toward the pad,
the first terminal portion comprises
a first fixing portion which is provided extending from one end of the first plate-shaped portion and is fixed to the lid portion, and
a first contacting portion which is provided extending from another end of the first plate-shaped portion and contacts the pad; and
the second terminal portion comprises
a second fixing portion which is provided extending from one end of the second plate-shaped portion and is fixed to the lid portion, and
a second contacting portion which is provided extending from another end of the second plate-shaped portion and contacts the pad,
a distance between the first contacting portion and the second contacting portion is greater than a distance between the first fixing portion and the second fixing portion.

7. The semiconductor device according to claim 5, wherein:
in the first plate-shaped portion, a region closer to the first fixing portion has a higher density of the concave portion than a region closer to the first contacting portion; and
in the second plate-shaped portion, a region closer to the second fixing portion has a higher density of the concave portion than a region closer to the second contacting portion.

8. The semiconductor device according to claim 5, wherein the first fixing portion and the second fixing portion have a plate shape.

9. The semiconductor device according to claim 8, wherein:
a normal direction of a principal surface of the first fixing portion is parallel to an extending direction of the first plate-shaped portion; and
a normal direction of a principal surface of the second fixing portion is parallel to an extending direction of the second plate-shaped portion.

10. The semiconductor device according to claim 3, wherein the concave portion is formed over a greater area in the second plate-shaped portion than in the first plate-shaped portion.

\* \* \* \* \*